(12) United States Patent
Li

(10) Patent No.: US 7,638,170 B2
(45) Date of Patent: Dec. 29, 2009

(54) LOW RESISTIVITY METAL CARBONITRIDE THIN FILM DEPOSITION BY ATOMIC LAYER DEPOSITION

(75) Inventor: Wei-Min Li, Espoo (FI)

(73) Assignee: ASM International N.V., BC Bilthoven (NL)

( * ) Notice: Subject to any disclaimer, the term of this patent is extended or adjusted under 35 U.S.C. 154(b) by 215 days.

(21) Appl. No.: 11/766,367

(22) Filed: Jun. 21, 2007

(65) Prior Publication Data

US 2008/0317955 A1 Dec. 25, 2008

(51) Int. Cl.
*C23C 16/36* (2006.01)

(52) U.S. Cl. .................... 427/255.39; 427/255.391; 427/255.394; 117/88; 117/89

(58) Field of Classification Search ............ 427/255.39, 427/255.391, 255.394; 117/88, 89
See application file for complete search history.

(56) References Cited

U.S. PATENT DOCUMENTS

| | | | |
|---|---|---|---|
| 4,058,430 A | 11/1977 | Suntola et al. | |
| 5,208,069 A * | 5/1993 | Clark et al. ................. | 427/226 |
| 5,342,652 A | 8/1994 | Foster et al. | |
| 5,595,784 A | 1/1997 | Kaim et al. | |
| 5,691,235 A | 11/1997 | Meikle et al. | |
| 5,711,811 A | 1/1998 | Suntola et al. | |
| 5,723,384 A | 3/1998 | Park et al. | |
| 5,916,365 A | 6/1999 | Sherman | |
| 6,015,590 A | 1/2000 | Suntola et al. | |
| 6,087,257 A | 7/2000 | Park et al. | |
| 6,203,613 B1 | 3/2001 | Gates et al. | |
| 6,284,646 B1 | 9/2001 | Leem | |
| 6,287,965 B1 | 9/2001 | Kang et al. | |
| 6,342,277 B1 | 1/2002 | Sherman | |
| 6,355,561 B1 | 3/2002 | Sandhu et al. | |
| 6,416,577 B1 | 7/2002 | Suntoloa et al. | |
| 6,482,262 B1 | 11/2002 | Elers et al. | |
| 6,482,733 B2 | 11/2002 | Raaijmakers et al. | |
| 6,534,395 B2 | 3/2003 | Werkhoven et al. | |
| 6,599,572 B2 | 7/2003 | Saanila et al. | |
| 6,706,115 B2 | 3/2004 | Leskela et al. | |

(Continued)

FOREIGN PATENT DOCUMENTS

EP 0 899 779 3/1999

(Continued)

OTHER PUBLICATIONS

Song, Moon-Kyun, et al., "Phase Formation in the Tantalum Carbonitride Film Deposited with Atomic Layer Deposition Using Ammonia". Journal of the Electrochemical Society 155 (10) H823-H828, 2008.*

(Continued)

*Primary Examiner*—Bret Chen
(74) *Attorney, Agent, or Firm*—Knobbe, Martens, Olson & Bear LLP

(57) ABSTRACT

Thermal atomic layer deposition processes are provided for growing low resistivity metal carbonitride thin films. Certain embodiments include methods for forming tantalum carbonitride (TaCN) thin films. In preferred embodiments, TaCN thin films with a resistivity of less than about 1000 $\mu\Omega\cdot$cm are grown from tantalum halide precursors and precursors that contribute both carbon and nitrogen to the growing film. Such precursors include, for example, hexamethyldisilazane (HMDS), tetramethyldisilazane (TMDS), bisdiethylaminosilane (BDEAS) and hexakis(ethylamino)disilane (HEADS).

22 Claims, 4 Drawing Sheets

U.S. PATENT DOCUMENTS

| | | | |
|---|---|---|---|
| 6,727,169 | B1 | 4/2004 | Raaijmakers et al. |
| 6,780,704 | B1 | 8/2004 | Raaijmakers et al. |
| 6,800,552 | B2 | 10/2004 | Elers et al. |
| 6,821,825 | B2 | 11/2004 | Todd et al. |
| 6,858,524 | B2 | 2/2005 | Haukka et al. |
| 6,869,876 | B2 * | 3/2005 | Norman et al. ............ 438/680 |
| 6,900,115 | B2 | 5/2005 | Todd |
| 6,958,253 | B2 | 10/2005 | Todd |
| 6,962,859 | B2 | 11/2005 | Todd et al. |
| 6,986,914 | B2 | 1/2006 | Elers et al. |
| 7,079,903 | B2 * | 7/2006 | O'Brien ....................... 607/122 |
| 7,081,271 | B2 | 7/2006 | Chung et al. |
| 2001/0041250 | A1 | 11/2001 | Werkhoven et al. |
| 2005/0064684 | A1 | 3/2005 | Todd et al. |
| 2005/0118837 | A1 | 6/2005 | Todd et al. |
| 2005/0250302 | A1 | 11/2005 | Todd et al. |
| 2005/0255713 | A1 * | 11/2005 | Taguchi et al. ............. 438/792 |
| 2006/0060137 | A1 | 3/2006 | Hasper et al. |
| 2006/0199357 | A1 | 9/2006 | Wan et al. |
| 2007/0026621 | A1 * | 2/2007 | Cho et al. .................. 438/314 |
| 2007/0116888 | A1 * | 5/2007 | Faguet ........................ 427/569 |
| 2007/0210702 | A1 * | 9/2007 | Nakamura ................ 313/504 |

FOREIGN PATENT DOCUMENTS

| | | |
|---|---|---|
| JP | 8 264 530 | 10/1996 |
| WO | WO 00/47404 | 8/2000 |
| WO | WO 00/54320 | 9/2000 |
| WO | WO 01/27347 | 4/2001 |
| WO | WO 01/29280 | 4/2001 |
| WO | WO 01/29893 | 4/2001 |
| WO | WO 01/53565 | 7/2001 |
| WO | WO 2007/041124 * | 4/2007 |

OTHER PUBLICATIONS

Engbrecht, E.R., et al., "Chemical Vapor Deposition Growth and Properties of TaCxNy". Thin Solid Films 418 (2002) pp. 145-150.*
Wang, Shui Jinn, et al., "Influence of Nitrogen Doping on the Barrier Properties of Sputtered Tantalum Carbide Films for Copper Metallization". Jpn. J. Appl. Phys. vol. 40 (2001), pp. 6212-6220.*
U.S. Appl. No. 11/766,625, filed Jun. 21, 2007, Hendriks et al.
Andricacos, et al., "Damascene copper electroplating for chip," *IBM Jour. Research and Dev.,* 42:567 (1998).
Elers, et al., "NbCl5 as a precursor in atomic layer epitaxy," *Applied Surface Science,* 82/83:468-474 (1994).
Hiltunen, et al., "Nitrides to titanium, niobium, tantalum and molybdenum grown as thin films by the atomic layer epitaxy method," *Thin Solid Films,* 166:149-154 (1988).
Klaus, J.W., et al., "Atomically controlled growth of tungsten and tungsten nitride using sequential surface reactions," *Appl. Surf. Science* 162-163; 479-471 (2000).
Klaus, J.W., et al., "Atomic layer deposition of tungsten nitride films using sequential surface reactions," *Journal of the Electrochemical Soc.,* 147 (3):1175-1181 (2000).
Klaus, J.W., et al., "Atomic layer deposition of tungsten using sequential surface chemistry with a sacrificial stripping reaction," *Thin Solid Films,* 360:145-153 (2000)n.
Leskela, et al., "ALD precursor chemistry: Evolution and future challenges," *Jour. Phys. IV France 9,* 837-852 (1999).
Ritala, et al., "Effects of intermediate zinc pulses on properties of TiN and NbN films deposited by atomic layer epitaxy," *Appl. Surf. Sci.,* 120:199-212 (1997).
Ritala, et al., "Perfectly conformal TiN and Al2O3 films deposited by atomic layer deposition," *Chem. Vapor Deposition,* 5:7-9 (1999).
Ryu, et al., "Barriers for copper interconnections," *Solid State Technology,* Apr., 53 (1999).

* cited by examiner

LOW RESISTIVITY METAL CARBONITRIDE THIN FILM DEPOSITION BY ATOMIC LAYER DEPOSITION

RELATED APPLICATIONS

The present application is related to U.S. Pat. No. 6,706,115, issued Mar. 16, 2004, the disclosure of which is incorporated by reference herein for it descriptions of general thermal ALD conditions, and more particularly reactants and mechanisms for deposition of metal and nitrogen compounds. The present application is also related to U.S. patent application Ser. No. 11/766,625, filed on even date herewith, of Menso Hendriks, entitled METHOD FOR DEPOSITING THIN FILMS BY MIXED PULSED CVD AND ALD.

FIELD OF THE INVENTION

The present invention relates generally to deposition of metal carbonitride thin films. More particularly, the present invention relates to low resistivity tantalum carbonitride thin films deposited on a substrate by thermal atomic layer deposition (ALD).

BACKGROUND OF THE INVENTION

Atomic layer deposition (ALD), originally known as atomic layer epitaxy (ALE), is an advanced form of vapor deposition. ALD processes are based on sequential, self-saturated surface reactions. Examples of these processes are described in detail in U.S. Pat. Nos. 4,058,430 and 5,711,811. The described deposition processes benefit from the usage of inert carrier and purging gases, which make the system fast. Due to the self-saturating nature of the process, ALD enables almost perfectly conformal deposition of films on an atomic level and precise thickness control.

Low resistivity metallic films, such as metal carbide, metal nitride and metal carbonitride thin films are important materials for metallization applications in the semiconductor industry. These applications include, for example, gate metals, copper diffusion barriers for copper interconnects, metal electrodes for capacitors, and resistors. These applications typically call not only for low resistivity, but also for precise control of film thicknesses and/or excellent conformality in high aspect ratio structures. As a result, a thermal ALD process would be advantageous. In particular, in the case of tantalum-containing thin films, it has been difficult to deposit a thin film that has both low resistivity and a sufficiently low process temperature without supplying external energy, such as in plasma assisted deposition processes.

SUMMARY OF THE INVENTION

Methods are provided for depositing metal carbonitride thin films, such as tantalum carbonitride thin films, on a substrate in a reaction space by an atomic layer deposition (ALD) process. In one aspect, the ALD process includes providing alternating pulses of reactants in a plurality of deposition cycles. Each cycle includes supplying a pulse of a metal halide reactant to the substrate, and supplying a pulse of a second reactant to the substrate. The second reactant includes carbon and nitrogen to be included in the metal carbonitride thin films. Preferably the metal carbonitride thin films have a resistivity below about 2000 $\mu\Omega\cdot$cm, and more preferably less than 1000 $\mu\Omega\cdot$cm, as-deposited or annealing. An example of a metal halide is a fluoride such as $TaF_5$.

In the illustrated embodiments alternating and sequential vapor phase pulses, reactant pulses are separated by inert gas flow periods that purge the reactants and reaction by-products. A first metal reactant contributes metal, such as tantalum, to the growing film. A second reactant preferably contributes one or both of carbon and nitrogen to the growing film. In some embodiments the second reactant is an amino-substituted silanes or methyl-substituted silanes. In preferred embodiments, the second reactant is selected from the group consisting of hexamethyldisilazane (HMDS), tetramethyldisilazane (TMDS), bisdiethylaminosilane (BDEAS) and hexakis(ethylamino)disilane (HEADS). In some arrangements, additional reactants can also be employed within one or more ALD cycles of a deposition process.

In another aspect, a method is provided for forming a metal carbonitride film with a resistivity of less than 1000 $\mu\Omega\cdot$cm on a substrate. The method includes depositing a metal carbonitride thin film on the substrate by a thermal atomic layer deposition process. The process includes providing alternated pulses of a metal precursor reactant and a reactant that includes both nitrogen and carbon. The reactant has a bond structure of the formula —Si—N—$R_x$, in which R is any carbon chain or hydrogen and each R can be selected independently. A plurality of such deposition cycles that include those pulses are conducted. The metal carbonitride thin film has at least about 3 at. % carbon. The metal carbonitride thin film is annealed to leave the metal carbonitride thin film with a resistivity of less than 1000 $\mu\Omega\cdot$cm. Examples of the reactant that includes both nitrogen and carbon include BDEAS $(Et_2N)_2SiH_2$ and HEADS $(EtNH)_3SiSi(EtNH)_3$.

In another aspect the invention, a method is provided for forming a TaCN thin film on a substrate within a reaction space by an atomic layer deposition (ALD) type process. The ALD process comprises providing alternating pulses of reactants in a plurality of deposition cycles. Preferably, each cycle comprises supplying in order: $TaF_5$; $NH_3$; and a reactant selected from the group consisting of hexamethyldisilazane (HMDS), tetramethyldisilazane (TMDS), bisdiethylaminosilane (BDEAS) and hexakis(ethylamino)disilane (HEADS). Excess reactant and/or reactant byproducts are preferably removed from the reaction space prior to supplying the next reactant.

BRIEF DESCRIPTION OF THE DRAWINGS

These and other aspects of the invention will be readily apparent to the skilled artisan in view of the description below and the appended drawings, which are meant to illustrate and not to limit the invention, and in which.

DETAILED DESCRIPTION OF THE PREFERRED EMBODIMENT

Figure 1:
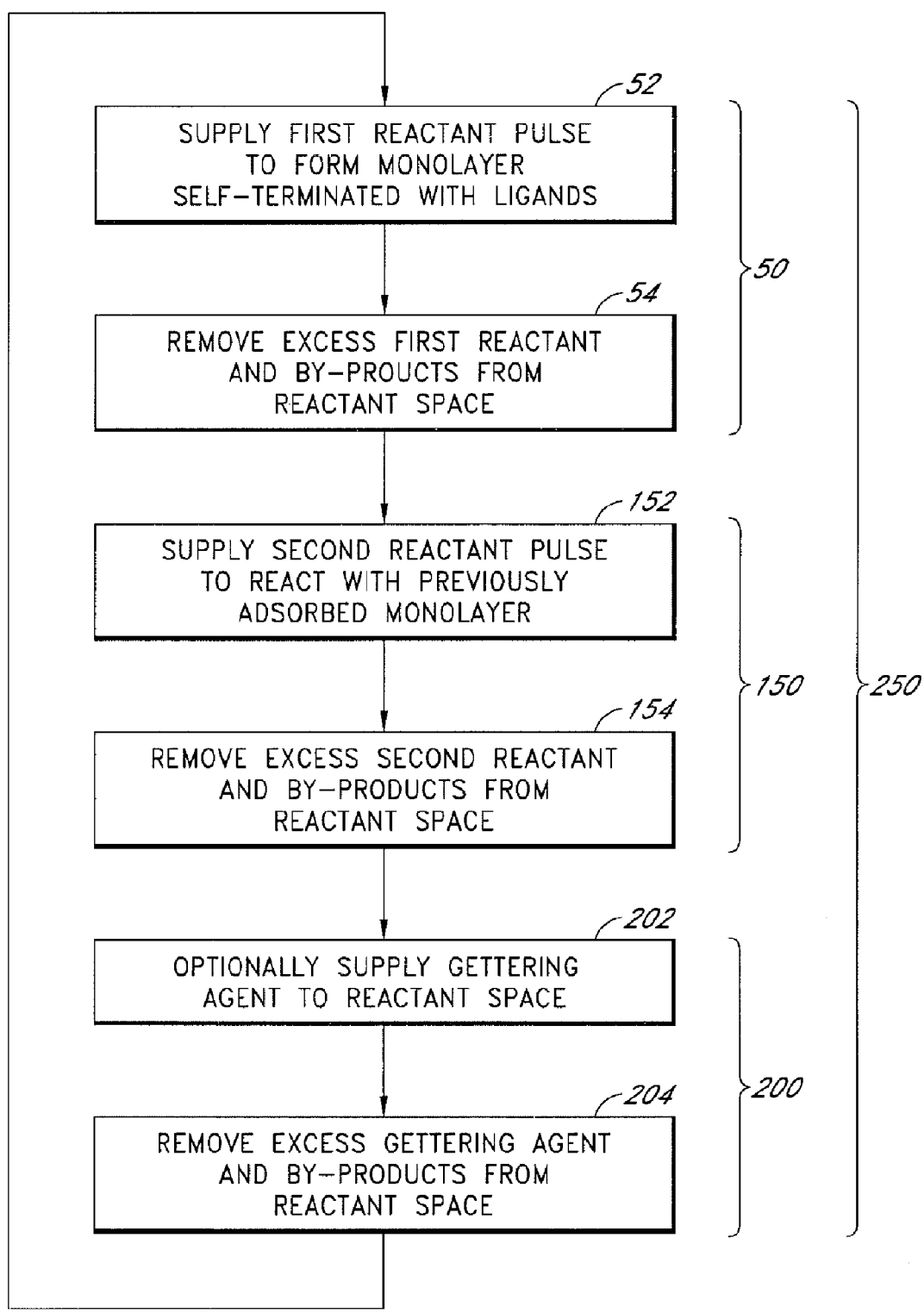
FIG. 1 is a flow chart generally illustrating a method of forming a tantalum carbonitride thin film by atomic layer deposition (ALD), in accordance with several of the preferred embodiments.

The present disclosure teaches methods for depositing metal compound thin films, particularly tantalum carbonitride thin films, by a thermal ALD type process. The thin films preferably have a low resistivity and good uniformity. The skilled artisan will appreciate that the present methods have applications in many contexts, particularly including semiconductor or integrated circuit processing.

In one embodiment, the metallic thin films described herein are employed for barrier formation in integrated circuit metallization applications. Often barriers are required between copper lines and interlevel dielectric materials to prevent diffusion of copper between features or lines. The barriers, however, occupy valuable space for conductors, and detract from conductivity and thus speed. ALD methods, such as those described herein, provide excellent conformality for such metallization barrier applications and thus maximize space available for copper, as taught for example in U.S. Pat. No. 6,727,169, the disclosure of which is incorporated by reference herein for purposes of illustrating the context of lining dual damascene trenches and vias with ALD lining layers. Moreover, the methods taught herein also provide reduced resistivity for barrier materials that are nevertheless effective as diffusion barriers. In another embodiment, the metallic thin films taught herein are employed in capacitor electrodes or transistor gate electrodes for integrated circuit memory applications. The disclosure of U.S. Pat. No. 6,780,704 is incorporated herein for the purpose of illustrating an exemplary capacitor context in which application of barrier materials as taught herein could be beneficial in electrodes for capacitors employing high dielectric constant materials. While the '704 patent discloses a stacked capacitor, hemispherical grain (HSG) silicon structure, this is exemplary only, and the barriers taught herein can be applied to deep trench capacitors or stacked, folding capacitor structures for DRAM circuits, for example. In both contexts, the provision by the present application of less resistive and more conformal barrier thin films is desirable. The disclosure of U.S. Pat. No. 6,858,524 is incorporated herein for the purpose of illustrating exemplary contexts for application of barrier materials in gate electrode stacks.

DEFINITIONS

For the purpose of the present description, an "ALD process" designates a process in which deposition of material onto a surface is based on sequential and alternating self-saturating surface reactions. The general principles of ALD are disclosed, e.g., in U.S. Pat. Nos. 4,058,430 and 5,711,811, the disclosures of which are incorporated herein by reference. Generally, conditions for ALD include a temperature window wherein the substrate is above the temperature at which reactant gases or vapors condense and below the temperature at which the reactant gases or vapors thermally decompose.

"Reaction space" is used to designate a reactor or reaction chamber, or an arbitrarily defined volume therein, in which conditions can be adjusted to effect thin film growth by ALD. Typically the reaction space includes surfaces subject to all reaction gas pulses from which gases or particles can flow to the substrate, by entrained flow or diffusion, during normal operation.

"Adsorption" is used to designate a chemical attachment of atoms or molecules on a surface.

"Surface" is used to designate a boundary between the reaction space and a feature of a substrate.

"Thin film" means a film that is formed from elements or compounds that are transported as ions, atoms or molecules via vacuum, gaseous phase or liquid phase from the source to the substrate. The thickness of the film depends upon the application and may vary in a wide range, preferably from about one atomic layer to 1,000 nm.

"Metallic thin film" designates a thin film that comprises one or more metals. In preferred embodiments, a metallic thin film is a metal compound thin film, particularly a metal carbonitride (e.g., TaCN). However, metallic thin film may also be made in accordance with the teachings herein to form other metal compound films such as a metal carbide or metal nitride.

Preferred ALD Methods

The methods presented herein allow deposition of conformal metal carbonitride films on substrate surfaces. Geometrically challenging applications are also possible due to the self-limited nature of the surface reactions. Experiments have shown that it is possible to apply the methods taught herein to depositing thin films into features with aspect ratios of up to 60:1 and higher. In some experiments the deposited films were annealed at a temperature of about 1050° C. and had a step coverage of greater than 98% and up to about 100%.

According to the preferred embodiments, an atomic layer deposition (ALD) type process is used to form metal carbonitride thin films, particularly low-resistivity tantalum carbonitride thin films, on substrates, such as integrated circuit workpieces.

A substrate or workpiece placed in a reaction chamber is subjected to alternately repeated surface reactions. In particular, thin films are formed by repetition of a self-limiting ALD cycle. Preferably, each ALD cycle comprises at least two distinct phases. In the case of metal carbonitride thin film deposition, three different source chemicals can be employed, corresponding to the three phases. One reactant will adsorb no more than about one monolayer on the substrate surface and includes a metal species desired in the layer being deposited. A preferred metal is tantalum. This reactant, also referred to herein as "the metal reactant," is preferably a halide, and thus the adsorbed monolayer is terminated with halogen ligands. Another reactant preferably contains at least one other species desired in the layer being deposited, particularly nitrogen or carbon. However, in the preferred embodiments, the second reactant comprises both nitrogen and carbon. This reactant is typically not a halide. In the preferred embodiments the second reactant contains silicon in addition to carbon and nitrogen, and can be selected from the group consisting of hexamethyldisilazane (HMDS), tetramethyldisilazane (TMDS), bisdiethylaminosilane (BDEAS) and hexakis(ethylamino)disilane (HEADS).

In some embodiments a carbonitride film is deposited and the second reactant is the only reactant that contributes nitrogen and carbon to the growing film. That is, no other additional nitrogen or carbon sources are utilized in the ALD process. However, in other embodiments nitrogen and carbon may be provided by separate reactants.

Additional reactants may also be included in the process and may, for example, contribute one or more species to the growing film. In some embodiments, an additional reactant may be a gettering agent that is capable of scavenging or gettering corrosive species. In one embodiment, in addition to acting as a gettering agent the third reactant also provides a species to the thin film, such as carbon. Depending upon the other reactants and deposition conditions, such a gettering agent may be, for example, triethyl boron ("TEB"). Additional reactants may be provided in each deposition cycle, or at intervals in the deposition process, for example every second, third, fourth, fifth, etc. . . . deposition cycle.

A preferred ALD cycle for depositing a metal carbonitride is illustrated in FIG. 1. In one phase of the ALD cycle ("the metal phase" or the "first phase") 50, a first reactant comprising a metal species ("metal reactant") is supplied in a first pulse 52 to the reaction chamber and chemisorbs to the substrate surface. The reactant supplied in this phase 50 is selected such that, under the preferred conditions, the amount of reactant that can be bound to the surface is determined by the number of available binding sites and by the physical size of the chemisorbed species (including ligands). The chemisorbed layer left by a pulse of the metal reactant is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting.

Maximum step coverage on the workpiece surface is obtained when no more than about a single molecular layer of metal source chemical molecules is chemisorbed in each self-limiting pulse. Due to the size of the chemisorbed species and the number of reactive sites, somewhat less than a monolayer may be deposited in each pulse of metal reactant.

In the next phase of the cycle (the "second phase") 150, a pulse 152 of a second reactant is allowed to react with the molecules left on the substrate surface by the preceding pulse, if any. In the illustrated embodiment, in the phase 150 following chemisorption of the metal reactant, a carbon and nitrogen containing source chemical is preferably supplied to the reaction chamber. Carbon and nitrogen are incorporated into the thin film by the interaction of the carbon- and nitrogen-containing source chemical with the monolayer left by the metal reactant. This phase 150 is referred to herein as "the second phase" or the "species-contributing phase." In the preferred embodiment the carbon- and nitrogen-bearing precursor or source chemical also includes silicon and is selected from the group consisting of hexamethyldisilazane (HMDS), tetramethyldisilazane (TMDS), bisdiethylaminosilane (BDEAS) and hexakis(ethylamino)disilane (HEADS) and its reaction with the chemisorbed metal species produces a metal carbonitride layer on the substrate.

In some embodiments, in the second phase only a single species is contributed to the growing film. For example, the second reactant may be a carbon or nitrogen containing reagent and thus contribute carbon or nitrogen to the growing film, but not both. In these embodiments, one or more additional phases may be used to provide additional species to the film if additional species are desired. Thus, in one embodiment a metal carbonitride is grown by a process in which a metal reactant is provided in the first phase, a second reactant is provided in the second phase that contributes nitrogen to the growing film and a third reactant is provided in a third phase that contributes carbon to the growing film. In other embodiments the order of the phases can be changed, so long as the desired thin film is ultimately formed. One of skill in the art will recognize that, depending on the order of the phases, more than one deposition cycle may be required to deposit the desired metal carbonitride.

In some embodiments additional phases may be included to enhance the deposition process. For example, in an additional phase 200 of the ALD cycle a source chemical pulse 202 that is capable of gettering halides from the substrate surface and the reaction chamber may be provided. In addition, the gettering agent may comprise a species that may be incorporated into the thin film, such as carbon. The experiments described below, however, were conducted without getter phases and nevertheless obtained excellent film uniformity and resistivity. Thus, the ALD cycle 250 can comprise only precursor reactants, as in the two-phase cycle represented by phases 50 and 150, or can comprise precursors and gettering reactants.

Additional phases may be added to the ALD cycle 250 as desired. The skilled artisan will appreciate that the principles disclosed here can be readily applied to depositing binary, ternary or more complex materials by ALD. For example, an additional metal phase can be included to produce a film comprising two metal species. Thus, additional phases can be added to the cycle to produce a thin film with the desired composition. In other embodiments additional ALD cycles for depositing different materials can be utilized to produce more complex films.

Although referred to as the "first phase," the "second phase" and the "third phase," etc. . . . , these labels are for convenience and do not indicate the actual order of the phases in each ALD cycle. Thus, the initial ALD cycle may be started with any of the phases described above. However, one of skill in the art will recognize that if the initial ALD cycle does not begin with the metal reactant phase, at least two ALD cycles will need to be completed to deposit about a monolayer of the desired thin film. A phase is considered to immediately follow another phase if only a purge or other reactant removal step intervenes.

Unreacted source chemicals and reaction by-products are preferably removed from the reaction space between pulses of reactants. This may be accomplished by purging with an inert gas and/or with the aid of a vacuum pump.

The ALD cycle is preferably repeated until a thin film of the desired thickness is grown. Each ALD cycle may be identical in the deposition process. However, in some embodiments the nature of the ALD cycles may be varied. For example, some ALD cycles in the deposition process may include provision of a gettering agent. In another example, ALD cycles for depositing a first metal carbonitride can be combined with ALD cycles for depositing a second metal carbonitride in order to produce a more complex material.

In preferred embodiments the substrate on which deposition is desired, preferably a semiconductor workpiece, is loaded into a reactor. The reactor may be part of a cluster tool in which a variety of different processes in the formation of an integrated circuit are carried out. Exemplary reactors, designed specifically to enhance ALD processes, are commercially available from ASM America, Inc. (Phoenix, Ariz.) under the tradenames PULSAR® 2000 and PULSAR® 3000.

If necessary, the exposed surfaces of the workpiece are terminated to react with the first phase of the ALD process. The first phase of the preferred embodiment may be reactive, for example, with hydroxyl (OH) termination or termination left by an initial ammonia ($NH_3$) treatment. In some cases a separate termination step is not required.

After initial surface termination, if necessary, the first reactant pulse 52 is supplied to the workpiece. In accordance with the preferred embodiment, the first reactant pulse 52 comprises a carrier gas flow and a volatile halide species, preferably $TaF_5$, that is reactive with the workpiece surfaces of interest and further comprises a metal that is to form part of the deposited layer. Accordingly, a halogen-containing species adsorbs upon the workpiece surfaces. In the illustrated embodiment, the first reactant is a metal halide, and the thin film being formed comprises a metallic material, preferably metal carbonitride. The first reactant pulse 52 saturates the workpiece surfaces in a self-limiting manner such that any excess constituents of the first reactant pulse 52 do not further react with the monolayer formed by this process. Self-saturation results due to halide tails terminating the monolayer, protecting the layer from further reaction.

The first metal reactant pulse 52 is preferably supplied in vapor form. The metal reactant gas, preferably a metal halide, is considered "volatile" for purposes of the present description if the species exhibits sufficient vapor pressure under the process conditions to transport the species to the workpiece in sufficient concentration to saturate exposed surfaces. Some reactants can be sufficiently volatile to saturate the substrate under deposition conditions despite being liquid or solid under standard (room temperature and atmospheric pressure) conditions.

After sufficient time for a monolayer to adsorb on the substrate surface, the first reactant is then removed 54 from the reaction space. Preferably, removal 54 merely entails stopping the flow of the first chemistry while continuing to flow a carrier gas for a sufficient time to diffuse or purge excess reactants and reactant by-products from the reaction space, preferably with greater than about two reaction chamber volumes of the purge gas, more preferably with greater than about three chamber volumes. Preferably the removal 54 comprises continuing to flow purge gas for between about 0.1 seconds and 20 seconds after stopping the flow of the first reactant pulse. Together, the adsorption pulse 52 and reactant removal 54 represent the first phase 50 in the ALD cycle 250. The first phase 50 in the illustrated ALD cycle is thus the metal phase.

In the illustrated embodiment, a second reactant pulse 152 is then supplied to the workpiece. The second chemistry desirably reacts with or adsorbs upon the monolayer left by the first reactant. In the illustrated embodiment, this second reactant pulse 152 comprises supplying a precursor for both carbon and nitrogen to the workpiece with the aid of a carrier gas. Nitrogen- and carbon-containing species from the second reactant preferably react with the previously adsorbed monolayer to leave a carbonitride compound. In particular, where the first reactant comprises a metal halide, the second reactant pulse 152 leaves no more than about a monolayer of metal carbonitride. The second reactant pulse 152 also leaves a surface termination that operates to limit the deposition in a self-limiting, saturative reaction phase.

After a time period sufficient to completely saturate and react the monolayer with the second reactant pulse 152, any excess second reactant is removed 154 from the workpiece. As with the removal 54 of the first reactant, this removal 154 preferably comprises stopping the flow of the second chemistry and continuing to flow carrier gas for a time period sufficient for excess reactants and volatile reaction by-products from the second reactant pulse to diffuse out of and be purged from the reaction space. Together, the second reactant pulse 152 and removal 154 represent the second phase 150 in the illustrated process, and can also be considered a non-metal species-contributing phase, since an additional species is contributed to the growing thin film in the reaction. The second phase 150 can also be considered a non-halide species-contributing phase. In some embodiments, no other nitrogen- or carbon-contributing compounds are provided in the ALD cycle.

The two precursor phases 50, 150 described above can be alternated without a third reactant, or with a third reactant only intermittently after several cycles without it. The two phases 50, 150 thus together represent one ALD cycle 250, which is repeated to form metal carbonitride monolayers in an ALD process. While in the illustrated embodiment the ALD cycle begins with the metal phase, it is contemplated that in other embodiments the cycle may begin with the species contributing phase.

One of skill in the art will recognize that in the described two-phase cycle, the first reactant phase 50 generally reacts with the termination left by the second phase 150 in the previous cycle. Thus, while no reactant may be previously adsorbed on the substrate surface or present in the reaction space if the nitrogen and carbon-contributing phase is the first phase in the first ALD cycle, in subsequent cycles the nitrogen and carbon-contributing phase will effectively follow the non-metal species-contributing phase.

The ALD cycle 250 is repeated a number of times to produce a film sufficiently thick to perform its desired function.

As mentioned above, the cycle 250 can include only two alternated reactants. FIG. 1 is shown with an optional third reactant in the form of a gettering pulse 202 and removal 204. In still in other arrangements, additional chemistries can also be included in each cycle or in various select cycles throughout the deposition process. For example, if necessary, the cycle 250 can be extended to include a distinct surface preparation. Moreover, one or more additional phases can be conducted in each cycle. For example, phases may be included that add additional components to the growing thin film.

In the preferred embodiment, the first reactant comprises $TaF_5$, the second reactant is selected from the group consisting of hexamethyldisilazane (HMDS), tetramethyldisilazane (TMDS), and bisdiethylaminosilane (BDEAS), and no separate gettering step is provided, at least not in all cycles.

In practicing the preferred embodiments, the conditions in the reaction space are preferably arranged to minimize gas-phase reactions that can lead to the formation of condensed material. Thus, reactant chemical pathways are preferably kept separate until entering the reaction space. Reactions between species chemisorbed on the surface and a gaseous reactant self-saturate. Reactions between by-products and a gaseous getter, if used, form volatile chemical compounds.

The deposition can be carried out at a wide range of pressure conditions, but it is preferred to operate the process at reduced pressure. The pressure in the reactor is preferably maintained between about 0.01 mbar and 50 mbar, more preferably between about 0.1 mbar and 10 mbar.

The substrate temperature is kept low enough to keep the bonds between thin film atoms below the surface intact and to prevent thermal decomposition of the gaseous source chemicals. On the other hand, the substrate temperature is kept high enough to provide activation energy for the surface reactions for a thermal ALD process, and high enough to prevent the physisorption of source materials and minimize condensation of gaseous reactants in the reaction space. Depending on the reactants, the temperature of the substrate is typically about 100° C. to about 750° C., preferably about 200° C. to about 500° C., more preferably about 300° C. to about 450° C. In a particular embodiment, tantalum carbonitride is preferably deposited at a substrate temperature of about 400° C.

The temperature of the reactant vapors at their sources is preferably set below the substrate temperature. This is based on the fact that if the partial pressure of the source chemical vapor exceeds the condensation limit at the substrate temperature, controlled layer-by-layer growth of the thin film is compromised.

As the growth reactions are based on self-saturated surface reactions, there is no need for setting tight upper boundaries for pulse and purge times. The amount of time available for the pulsing cycle is limited mostly by the economic factors, such as desired throughput of the product from the reactor. Very thin film layers can be formed by relatively few pulsing cycles and in some cases this allows the use of low vapor pressure source materials with relatively long pulse times.

Deposited films preferably have low resistivity. In preferred embodiments, the as-deposited films have a resistivity of less than about 5000 $\mu\Omega\cdot cm$, more preferably less than about 2000 $\mu\Omega\cdot cm$ and still more preferably less than about 1000 $\mu\Omega\cdot cm$. Following deposition, the films can be annealed. Preferred annealing conditions are, for example from about 300° C. to about 1200° C., preferably from about 500° C. to about 1100° C. High temperature annealing can further reduce the resistivity of the deposited films, preferably to below about 1000 µΩ·cm (see FIG. 4).

Source Materials

In general, the precursors or source materials, (e.g., metal source materials, nitrogen and carbon-bearing source materials), are preferably selected to provide sufficient vapor pressure, sufficient thermal stability at the desired substrate temperature and sufficient reactivity of the compounds for effecting deposition by ALD. "Sufficient vapor pressure" supplies enough source chemical molecules in the gas phase to the substrate surface to enable self-saturated reactions at the surface at the desired rate. "Sufficient thermal stability" means that the source chemical itself does not form growth-disturbing condensable phases on the surface or leave harmful level of impurities on the substrate surface through thermal decomposition. In other words, temperatures are kept above the condensation limits and below the thermal decomposition limits of the selected reactant vapors. One aim is to avoid uncontrolled condensation of molecules on the substrate. "Sufficient reactivity" results in self-saturation in pulses short enough to allow for a commercially acceptable throughput time. Further selection criteria include the availability of the chemical at high purity and the ease of handling of the chemical.

1. Metal Source Materials

Metallic thin films, such as transition metal nitride, carbide and carbonitride layers, are preferably prepared from metal source materials. More preferably they are prepared from the volatile or gaseous compounds of transition metals of groups 3, 4, 5, 6, 7, 8, 9, 10, 11 and/or 12 of the periodic table of the elements. Metal thin film layers may also be made from starting materials comprising Cu, Ru, Pt, Pd, Ag, Au, and/or Ir.

The first reactants of the preferred embodiments comprise halides, more preferably metal halides and even more preferably transition metal halides comprising elements selected from groups IV (Ti, Zr and Hf), V (V, Nb and Ta) and VI (Cr, Mo and W) in the periodic table of elements. Fluorides, chlorides, bromides and iodides of transition metals are preferably used, more preferably transition metal fluorides, depending on the specific metal. Examples of suitable transition metal fluoride source chemicals include, without limitation, titanium tetrafluoride $TiF_4$, vanadium pentafluoride $VF_5$, niobium pentafluoride ($NbF_5$), tantalum pentafluoride ($TaF_5$), chromium pentafluoride ($CrF_5$), molybdenum hexafluoride ($MoF_6$), molybdenum pentafluoride ($MoF_5$) and tungsten hexafluoride ($WF_6$). In preferred embodiments the metal source material is a tantalum halide, more preferably $TaF_5$.

As previously noted, metal halides, and particularly the metal fluorides listed above, are typically fairly volatile and therefore excellent vehicles for delivery of metal to the workpiece. Moreover, halogen tails terminate the surface of the chemisorbed monolayer, inhibiting further reaction. The surfaces are thus saturated in a self-limiting manner in each cycle to promote uniform film growth.

2. Source Materials for Carbon- and Nitrogen-Contributing Reactant

The species-contributing reactant generally contributes nitrogen and carbon to the growing film. Further, the species-contributing compound is preferably volatile or gaseous. In the case of metal carbonitride deposition the species-contributing compound preferably provides nitrogen and carbon to the metal carbonitride deposition process. For deposition of metal carbonitride thin films the species contributing reactant is preferably a silicon compound such as an aminosilane or silazane compound, more preferably an alkylaminosilane or alkylsilazane compound. Most preferably the carbon- and nitrogen-containing source chemical comprises a bond structure of —Si—N—$R_x$, such as —Si—N—$R_2$ (like in BDEAS) or —NR'—Si—R"$_3$ (like in HMDS), in which R, R' and R" can be any carbon chain, for example alkyl, or hydrogen, and each R can be selected independently from each other (e.g. R can comprise, for example H and $CH_3$). In preferred embodiments, the species contributing reactant is selected from the group consisting of hexamethyldisilazane (HMDS), tetramethyldisilazane (TMDS), bisdiethylaminosilane (BDEAS) and hexakis(ethylamino)disilane (HEADS). In some arrangements, supplemental carbon and/or nitrogen precursors can also be employed, either along the second reactant pulse 152 or in separate pulses. The experiments below were conducted without such supplemental sources and without separate gettering agents, and obtained excellent composition. Accordingly, the preferred species contributing reactants not only contribute carbon and nitrogen, but also serve as excellent reducing agents to reduce (i.e., remove ligands or tails from) the metal precursors (or fragments thereof) that absorb on the substrate in the first phase of ALD process.

Deposition of TaCN

In preferred embodiments tantalum carbonitride films are deposited by ALD. Preferred tantalum source chemicals are tantalum halides, such as $TaF_5$. Preferred nitrogen and carbon source chemicals are selected from the group consisting of hexamethyldisilazane (HMDS), tetramethyldisilazane (TMDS), bisdiethylaminosilane (BDEAS) and hexakis(ethylamino)disilane (HEADS). In particularly preferred embodiments, the nitrogen and silicon source chemical is TMDS. An inert gas, preferably $N_2$, is used as a carrier gas and as a purge gas.

In the first phase of an exemplary ALD process, a vapor phase pulse of $TaF_5$ (or another Ta source chemical) is provided to a reaction chamber to contact a substrate on which a TaCN film is to be deposited. Preferably the $TaF_5$ is pulsed for about 0.1 second to about 10 seconds, more preferably about 0.1 second to about 1.0 second, still more preferably for about 0.2 second. After sufficient time to allow the first reactant to adsorb $TaF_5$ largely intact (some F tails are lost during the adsorption process) to the substrate surface, excess reactant and reaction by products, if any, are removed by purging with an inert gas. The purge time is preferably from about 1 second to about 10 seconds, more preferably about 3 seconds.

After removal of excess reactant, TMDS (or another carbon and nitrogen source chemical) is pulsed to the reaction space. Preferably the TMDS is pulsed for about 0.1 second to about 10 seconds, more preferably about 0.1 second to about 1.0 second, still more preferably about 0.2 second.

The cycle is repeated until a TaCN film of the desired thickness is formed. In view of the disclosure herein, the skilled practitioner will be able to adapt the ALD process and number of cycles based on the particular context without undue experimentation.

For the preferred reactants, the deposition temperature is preferably about 100° C. to about 750° C., more preferably about 300° C. to about 500° C., most preferably about 375° C. to about 450° C. The deposited tantalum carbonitride film can be annealed, preferably at a temperature of about 700° C. to about 2000° C., more preferably at a temperature of about 1050° C. Very good reductions in resistivity and sheet resistance were observed for anneal between about 850° C. and 1050° C.

The tantalum carbonitride films preferably have a bulk resistivity of less than 5000 μΩ·cm. More preferably the films have a bulk resistivity of less than 2000 μΩ·cm. As will be recognized by the skilled artisan, film resistivity can vary considerably depending on the thickness of the film and therefore can be over 5000 μΩ·cm in the case of very thin films (generally less than about 3-5 nm depending upon the roughness of the film) After annealing, the film resistivity can drop to well below 1000 μΩ·cm. In addition, the precursors and deposition conditions are selected to leave both carbon and nitrogen from the precursor in the film. The as-deposited films preferably have a carbon content of at least about 3 at. %, particularly about 3 at-% to about 50 at-%, more preferably about 5 at-% to about 20 at-%. Measured carbon content can vary greatly depending upon the analytic technique used (for example, XPS and RBS) and thus it should be measured with at least two different techniques.

Example 1

The Deposition of TaCN from $TaF_5$ and Si-Containing C/N Precursors

A substrate was loaded into a Pulsar® 2000 ALD reactor, commercially available from ASM America Inc. (Phoenix, Ariz.). The substrate was heated to about 400° C. in a flowing nitrogen atmosphere.

$TaF_5$ was used as the tantalum source chemical and was kept at 80° C. to provide sufficient vapor pressure. Hexamethyldisilazane (HMDS), tetramethyldisilazane (TMDS), and bisdiethylaminosilane (BDEAS) were used as nitrogen- and carbon-contributing reagents in separate experiments and were maintained at room temperature. $N_2$ was used as a carrier gas and purge gas (200 sccm). The pressure was adjusted to about 200 torr.

A TaCN layer was grown by ALD from sequential pulses of $TaF_5$ and each of the three carbon- and nitrogen-contributing reagents. Pulses of source chemicals were separated by inert nitrogen gas pulses.

One deposition cycle consisted of the following steps:
$TaF_5$ pulse, for 0.2 s
$N_2$ purge for 3.0 s
TMDS, HMDS or bisdiethylaminosilane pulse for 0.2 s
$N_2$ purge for 3.0 s This cycle was repeated 150 times to form about 10 nm TaCN film.

Figure 2:
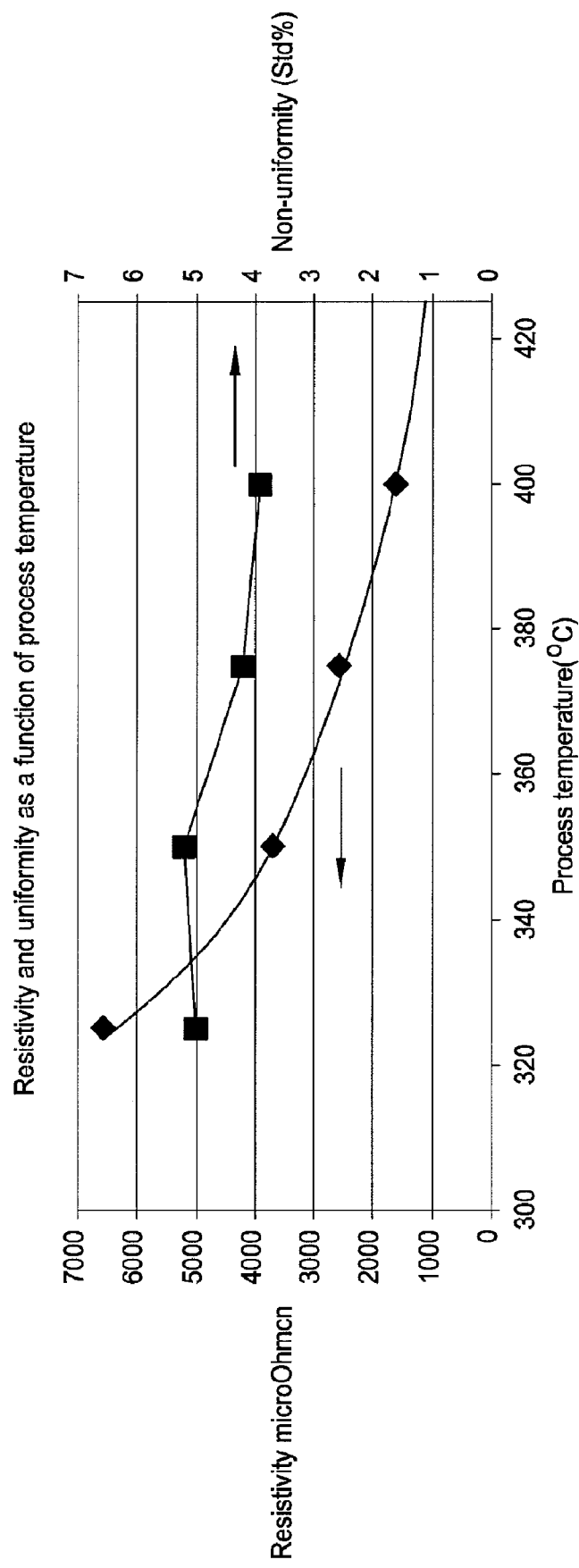
FIG. 2 is a graph illustrating resistivity and uniformity as a function of process temperature.
Figure 3:
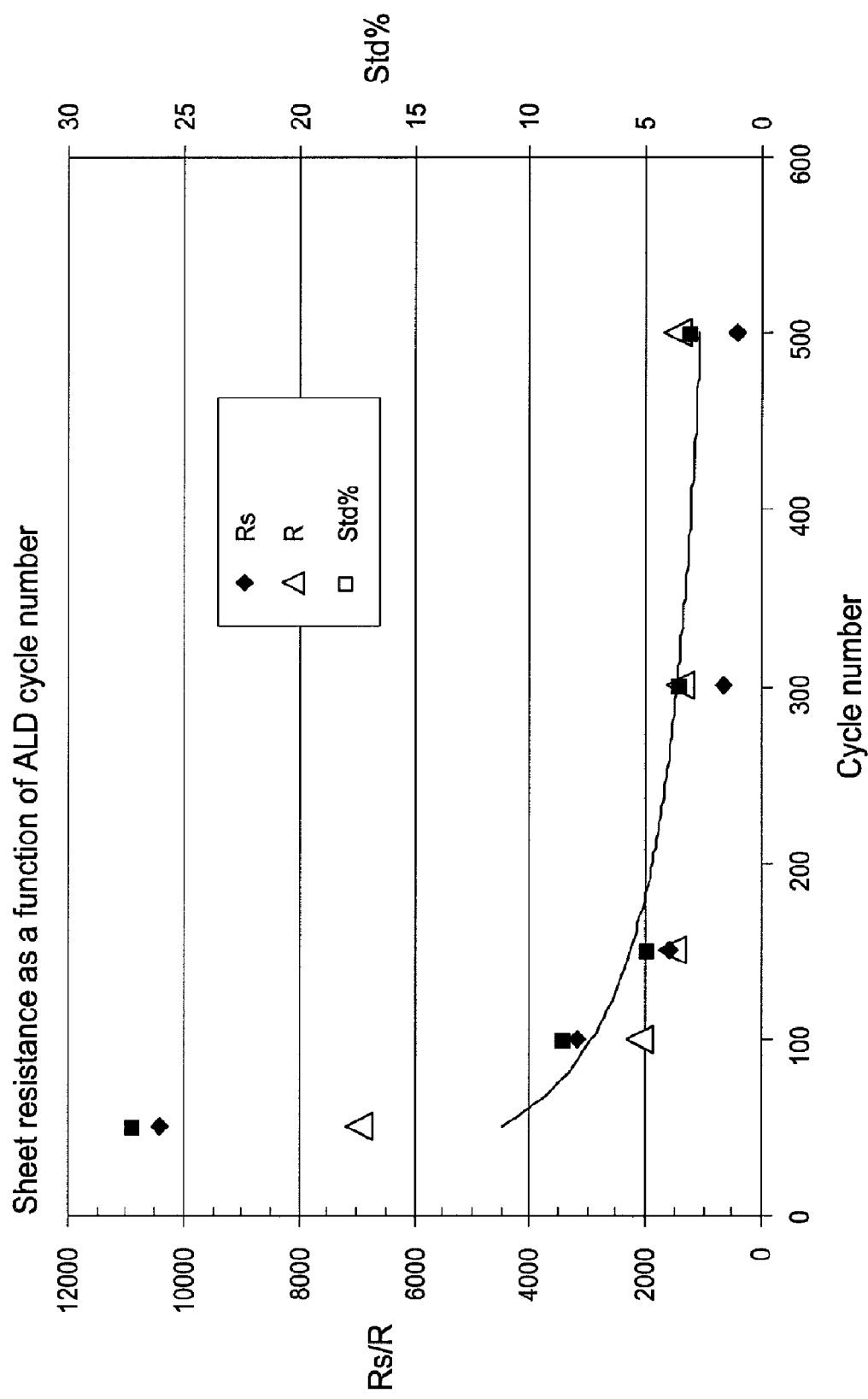
FIG. 3 is a graph illustrating sheet resistance as a function of number of ALD cycles performed.
Figure 4:
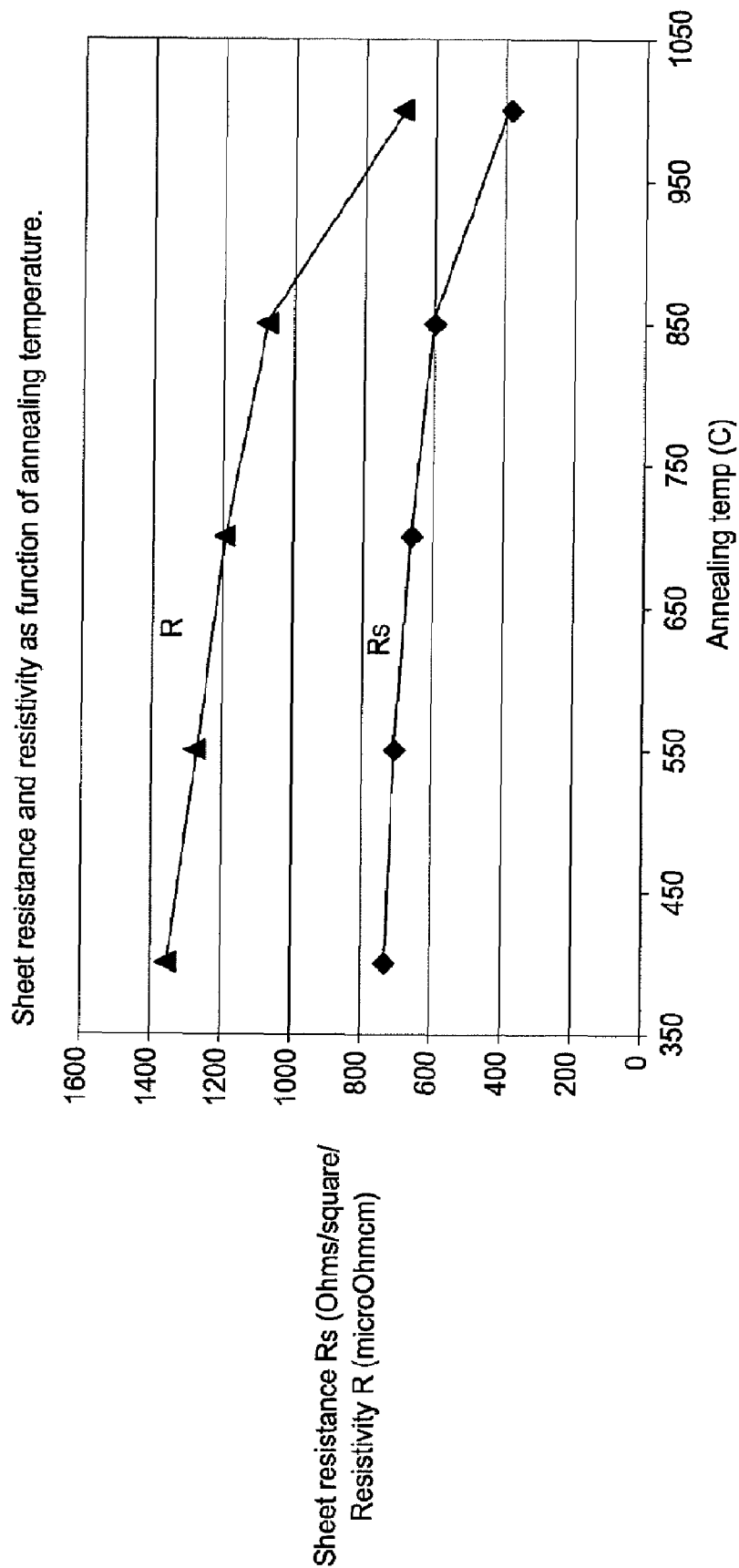
FIG. 4 is a graph illustrating sheet resistance and resistivity as a function of annealing temperature.

Using TMDS as the carbon and nitrogen-source chemical, the growth rate for the TaCN film was about 0.6-0.7 Å/cycle, using an XRR thickness measurement. A temperature of 400° C. gave the best measured sheet resistance and uniformity, as indicated in the actual results presented in FIG. 2. FIG. 3 illustrates a reduction in sheet resistance as deposition progresses in terms of cycles performed. FIG. 4 illustrates improvements in sheet resistance and resistivity after post-deposition annealing. Sharp improvements are observed for anneal temperatures between 850° C. and 1050° C.

Using TMDS as the carbon and nitrogen-containing precursor, XPS analysis of the thin film deposited showed 55.7% Ta, 23.7% N and 7.8% C. The film additionally comprised 8.8% O and 3.9% F. Using bisdiethylaminosilane, the deposited film comprised 51.6% Ta, 18.5% N, 14.9% C, 12.6% O and 2.4% F. With HMDS, the deposited film comprised 53.0% Ta, 28.9% N, 2.8% C, 13.5% O, 0.3% F and 1.5% Si.

The thermal ALD processes disclosed herein allows for the deposition of tantalum thin films, particularly TaCN, with desirable properties, including low resistivity, uniformity and high conformality, at a low deposition temperature.

Although the foregoing invention has been described in terms of certain preferred embodiments, other embodiments will be apparent to those of ordinary skill in the art, in view of the disclosure herein. Accordingly, the present invention is not intended to be limited by the recitation of the preferred embodiments, but is instead to be defined by reference to the appended claims.

I claim:

1. A method of forming a tantalum carbonitride (TaCN) thin film on the surface of a substrate within a reaction space by an atomic layer deposition (ALD) process, wherein the ALD process comprises providing alternating pulses of reactants in a plurality of deposition cycles, each cycle comprising:

supplying a pulse of a tantalum halide reactant to the substrate; and supplying a pulse of a second reactant to the substrate, wherein the second reactant comprising carbon and nitrogen to be included in the TaCN thin film, and wherein the second reactant is selected from the group consisting of hexamethyldisilazane (HMDS), tetramethyldisilazane (TMDS), bisdiethylaminosilane (BDEAS) and hexakis(ethylamino)disilane (HEADS).

2. The method of claim 1, wherein the second reactant comprises TMDS.

3. The method of claim 1, wherein the tantalum halide is $TaF_5$.

4. The method of claim 1, wherein the resistivity of the TaCN film is less than about 1000 μΩ·cm.

5. The method of claim 1, further comprising annealing the deposited TaCN film.

6. The method of claim 1, wherein the substrate temperature is between about 375° C. and about 450° C.

7. The method of claim 1, wherein the thin film is a barrier in a semiconductor metallization structure.

8. The method of claim 1, where the thin film is in a metal electrode in an integrated circuit.

9. The method of claim 1, wherein the thickness of the thin film is less than about 20 nm.

10. The method of claim 1, wherein no other reactant is pulsed to contribute nitrogen or carbon to the TaCN thin film.

11. The method of claim 1, wherein the TaCN film contains carbon in a concentration between about 5 atomic % and 20 atomic %.

12. A method of forming a metal carbonitride film with a resistivity of less than 1000 μΩ·cm on a substrate, the method comprising:

depositing a metal carbonitride thin film on the substrate by a thermal atomic layer deposition (ALD) process, the thermal ALD process including a plurality of deposition cycles comprising providing alternated pulses of a metal precursor and a reactant containing both nitrogen and carbon and having a bond structure of the formula Si—N—$R_x$, in which R is any carbon chain or hydrogen and each R can be selected independently, the metal carbonitride thin film containing greater than 3 at. % carbon; and annealing the metal carbonitride thin film after the plurality of deposition cycles to leave the metal carbonitride thin film with a resistivity of less than 1000 μΩ·cm.

13. The method of claim 12, wherein the reactant containing both nitrogen and carbon comprises at least one alkyl group.

14. The method of claim 12, wherein the reactant containing both nitrogen and carbon is selected from the group consisting of BDEAS $(Et_2N)_2SiH_2$ and HEADS $(EtNH)_3SiSi(EtNH)_3$.

15. The method of claim 12, wherein the metal precursor comprises $TaF_5$.

16. The method of claim 12, wherein the deposition temperature is between about 300° C. and about 500° C.

17. The method of claim 12, wherein the metal carbonitride thin film comprises a tantalum carbonitride (TaCN) thin film, wherein annealing the TaCN thin film comprises treating the at a temperature between about 850° C. and about 1050° C.

18. An atomic layer deposition process for depositing a tantalum carbonitride (TaCN) thin film on a substrate comprising a plurality of deposition cycles, each cycle comprising:

supplying $TaF_5$ to chemisorb no more than about one monolayer of a halide-terminated species over the surface;

removing excess $TaF_5$ and reaction by-products, if any, from the reaction space;

supplying TMDS to react with the chemisorbed $TaF_5$; and removing excess second reactant and reaction by-products, if any, from the reaction space.

19. The method of claim 18, wherein the substrate temperature is between about 375° C. and about 450° C.

20. The method of claim 18, wherein the TaCN thin film comprises between about 5 atomic % and about 20 atomic % carbon.

21. The method of claim 18, wherein the TaCN thin film has an as-deposited resistivity of less than about 2000 $\mu\Omega\cdot$cm.

22. The method of claim 18, further comprising annealing the TaCN thin film, wherein the TaCN thin film has a post-annealing resistivity of less than about 1000 $\mu\Omega\cdot$cm.

* * * * *